United States Patent [19]

Molina et al.

[11] Patent Number: 5,327,098
[45] Date of Patent: Jul. 5, 1994

[54] PROGRAMMABLE GAIN AMPLIFIER CIRCUITRY AND METHOD FOR BIASING JFET GAIN SWITCHES THEREOF

[75] Inventors: Johnnie F. Molina; R. Mark Stitt, II; Rodney T. Burt, all of Tucson, Ariz.

[73] Assignee: Burr-Brown Corporation, Tucson, Ariz.

[21] Appl. No.: 98,845

[22] Filed: Jul. 29, 1993

[51] Int. Cl.$^5$ .......................... H03G 3/30; H03F 3/45
[52] U.S. Cl. ..................... 330/254; 330/282; 330/296
[58] Field of Search ............ 330/86, 254, 258, 259, 330/261, 282, 296

[56] References Cited

U.S. PATENT DOCUMENTS

| | | | |
|---|---|---|---|
| 4,016,557 | 4/1977 | Zitelli et al. | 330/86 X |
| 4,393,351 | 7/1993 | Gregorian et al. | 328/127 |
| 4,438,354 | 3/1984 | Haque et al. | 307/493 |
| 4,500,845 | 2/1985 | Ehni | 330/86 |
| 4,617,481 | 10/1986 | Masuda | 307/491 |
| 4,855,685 | 8/1989 | Hochschild | 330/282 |

Primary Examiner—James B. Mullins
Attorney, Agent, or Firm—Cahill, Sutton & Thomas

[57] ABSTRACT

A circuit for reducing input offset error and improving gain switching speed in a programmable gain amplifier includes a level shifting buffer that senses a signal on a common mode conductor in a differential input stage of an operational amplifier, and shifts the level of that signal up to the level corresponding to a level of an input signal applied to a non-inverting input of the operational amplifier. If a gain select signal is at a first logic level, the voltage produced by the buffer is applied to a gate electrode of one of a plurality of gain switching JFETs coupling a gain network to the inverting input of the operational amplifier, turning that JFET on. If the gain select signal is at a second logic level, the output of the buffer is isolated from the gain switching JFET and a turn off voltage is applied to the gate of the gain switching JFET.

15 Claims, 4 Drawing Sheets

PROGRAMMABLE GAIN AMPLIFIER CIRCUITRY AND METHOD FOR BIASING JFET GAIN SWITCHES THEREOF

BACKGROUND OF THE INVENTION

The invention relates to circuitry biasing a field effect transistor having a source or drain coupled to an input of an amplifier so as to ensure that the field effect transistor is maintained in its triode region despite large changes in an input signal on an input of the amplifier, and more particularly to circuitry that greatly reduces input offset voltage due to parasitic leakage currents in JFET gain switches in a resistive gain network of a programmable gain amplifier and maintains selected JFETs in their triode regions irrespective of changes in the amplifier input signal.

Various programmable gain amplifiers (also referred to as switchable gain amplifiers are known in the art. For example, U.S. Pat. No. 4,855,685 discloses a typical programmable gain amplifier. Leakage currents from JFET switches commonly used in programmable gain amplifiers cause errors that degrade the gain accuracy. FIG. 4 shows a block diagram of a programmable gain amplifier including a high gain operational amplifier 50. Its non-inverting input receives the input voltage $V_{IN}$. The inverting input of amplifier 50 is connected by conductor 22 to an input of each of P-channel JFET switch circuits 30-1, 30-2 . . . 30-N. Each such JFET switch circuit connects a different feedback resistor junction of feedback resistors 24-1, 24-2 . . . 24-N to the inverting input 22, to thereby allow accurate setting the gain of the programmable gain amplifier if JFETs of the JFET switch circuits are maintained in their triode regions. A decoder circuit 58 responds to gain setting inputs 59 to determine which of the various JFET switch circuits 30-1 . . . 30-N are open and which are closed.

The JFET switch circuits 30-1 . . . 30-N must be biased so that when each is turned off its gate-to-channel PN junction is reverse biased beyond its pinch-off voltage. The JFET switch circuits also must be capable of operating at suitably high speed. The parasitic junction leakage currents of the JFET switch circuits influence the voltage on conductor 22 and thereby cause an input offset error in amplifier 50. An example of a switching circuit that might be used to implement the JFET switching circuits 30-1 . . . 30-N is shown in FIG. 5, but that switching circuit has very high parasitic gate-to-substrate leakage current, and would cause a high input offset voltage error in amplifier 50.

SUMMARY OF THE INVENTION

Accordingly, it is an object of the invention to provide a high speed programmable gain amplifier having low input offset errors.

It is another object of the invention to ensure that a turned on field effect transistor having a source or drain coupled to receive a common mode signal applied to an input of an amplifier is maintained in its triode region and is prevented from entering its current saturation region.

It is another object of the invention to provide circuitry useful in a programmable gain amplifier for greatly reducing or eliminating gain switch leakage currents flowing into the inverting input of the amplifier.

It is a general object of the invention to provide a circuit and technique for ensuring that a field effect transistor having a source or drain electrode coupled to an input of an amplifier remains in its triode region when the field effect transistor is in an on condition, despite large variations in a common mode voltage of the amplifier.

Briefly described, and in accordance with one embodiment thereof, the invention provides a circuit for reducing input offset error and improving gain switching accuracy and speed in a programmable gain amplifier. The circuit includes a level shifting buffer that senses a signal level on a "common mode" conductor in a differential input stage of a operational amplifier and shifts that signal level up to the level of an input signal applied to a non-inverting input of the operational amplifier. If a gain select signal is at a first logic level, the voltage produced by the buffer is applied to a gate electrode of one of a plurality of gain switching JFETs coupling a gain network to the inverting input of the operational amplifier, turning that gain switching JFET on. If the gain select input is at a second logic level, the output of the buffer is isolated from a gain switching JFET and a turnoff voltage is applied to the gate electrode of the gain switching JFET. In the described embodiment, first and second operational amplifiers receive first and second input signals at their non-inverting inputs. The outputs of the first and second operational amplifiers are coupled to the inputs of a difference amplifier, the output voltage of which is equal to the difference between the first and second input signals multiplied by the selected gain of the programmable gain amplifier. The gain network is coupled between the outputs of the first and second operational amplifiers. Separate buffers are connected to sense the signals and the common mode conductors in input stages of the first and second operational amplifiers, respectively. The various gain switching JFETs have their gate electrodes coupled to corresponding control circuits, a first group of which gate the output of the first buffer to gate electrodes of "selected" gain switching JFETs. Control circuits of a second group gate the output of the second buffer to gate electrodes of "selected" gain switching JFETs. The various control circuits apply a high voltage level to the gate electrodes of "unselected" gain switching JFETs connected thereto, and present high impedance to the gate electrodes of "selected" gain switching JFETs. The level shifting buffer circuits prevent forward biasing of gate-to-channel PN junctions of the various gain switching JFETs.

BRIEF DESCRIPTION OF THE DRAWINGS

FIG. 4 is a diagram useful in describing the prior art.

DETAILED DESCRIPTION OF THE PREFERRED EMBODIMENTS

Figure 1:
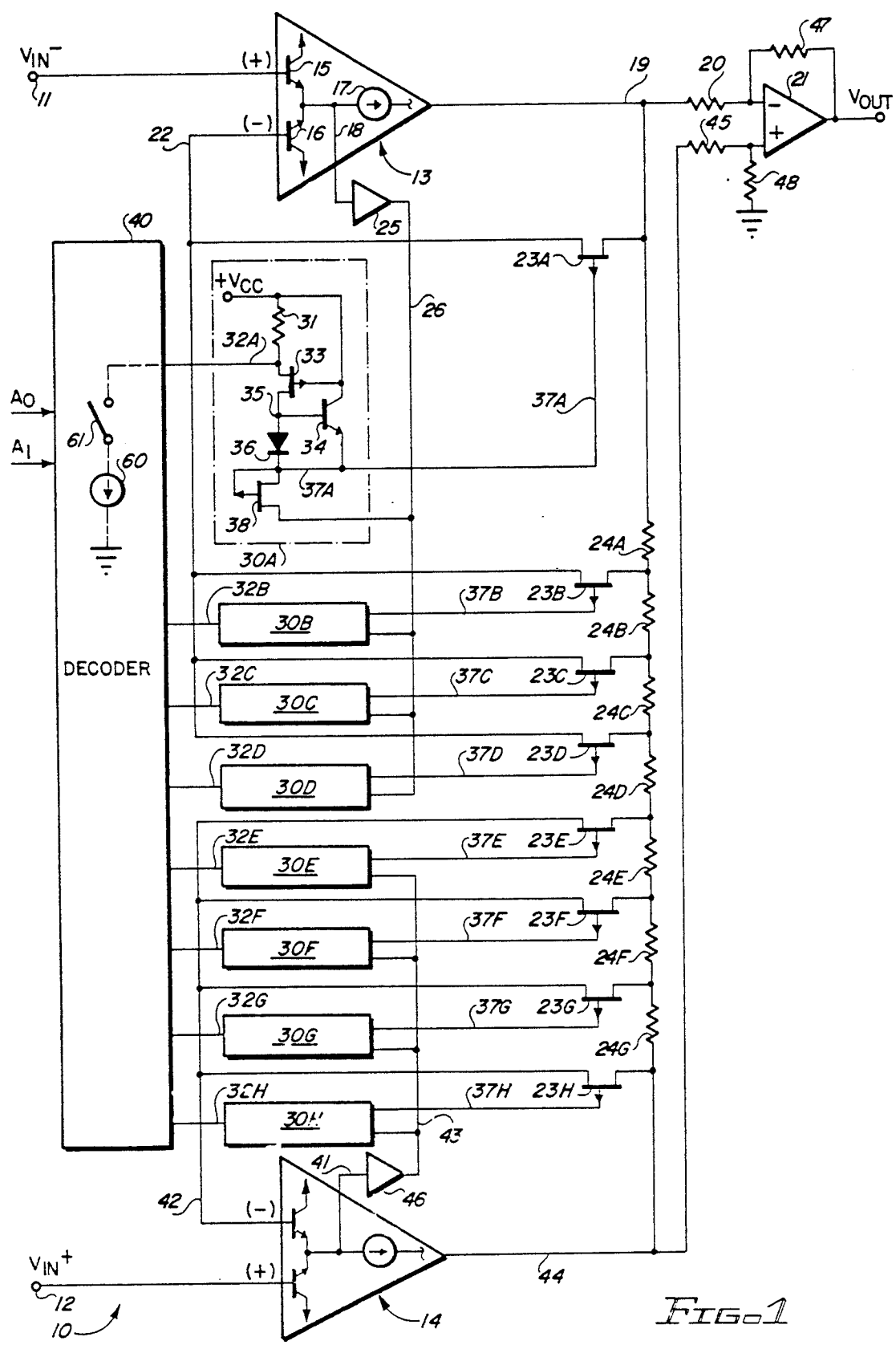
FIG. 1 is block diagram of a programmable gain amplifier of the present invention.

Referring to FIG. 1, programmable gain amplifier 10 applies a differential input voltage equal to the difference between $V_{IN}{}^-$ and $V_{IN}{}^+$ across input terminals 11 and 12. Input terminal 11 is connected to the non-inverting input of operational amplifier 13, and input terminal 12 is connected to the non-inverting input of operational amplifier 14. The output of amplifier 13 is coupled by conductor 19 and resistor 20 to the inverting input of a differential amplifier 21, and the output of amplifier 14 is coupled by conductor 44 and resistor 45 to the non-inverting input of differential amplifier 21. An output voltage $V_{PUT}$ is produced on the output of differential amplifier 21.

Resistors 24A-24G are series-connected between conductors 19 and 44. The inverting input of amplifier 13 is connected by conductor 22 to the drain electrodes of P-channel gain switch JFETs 23A-23D. The source electrodes of JFETs 23A-23D are connected to conductor 19, the junction between feedback resistors 24A and 24B, the junction between feedback resistors 24B and 24C, and the junction between feedback resistors 24C and 24D, respectively. Similarly, the inverting input of amplifier 14 is connected by conductor 42 to the drain electrodes of P-channel gain switch JFETs 23E-23H. The source electrodes of JFETs 23E-23H are connected to the junction between feedback resistors 24D and 24E, the junction between feedback resistors 24E and 24F, the junction between feedback resistors 24F and 24G, and conductor 44, respectively.

The gate electrodes of JFETs 23A-23H are connected by conductors 37A-37H to outputs of control circuits 30A-30H, respectively. Inputs of control circuits 30A-30H are connected by conductors 32A-32H, respectively, to outputs of a decoder circuit 40 which receives digital control input signals A0 and A1 to control which of the switch JFETs 23A-23H are opened and closed and thereby set the gain of programmable gain amplifier 10.

Amplifier 13 includes a differential input stage including an input NPN transistor 15 having its base connected to non-inverting input conductor 11. The emitter of transistor 15 is connected to the emitter of NPN transistor 16, which has its base connected to inverting input conductor 22. These two emitters are connected by conductor 18 to current source 17 and to the input of a level shifting buffer amplifier 25, the output of which is connected to conductor 26. Conductor 19 is sometimes referred to by those skilled in the art as a "common mode conductor" because it carries a voltage that is equal to or shifted by a constant voltage from the average of the voltage between the inverting and non-inverting inputs of the amplifier (assuming that the input transistors are matched). Conductor 26 is connected to a buffer input conductor of each of control circuits 30A-30D. Similarly, amplifier 14 contains two emitter-coupled NPN input transistors having their base electrodes connected to the non-inverting and inverting inputs, respectively, of amplifier 14. The common emitters of these two input transistors are coupled to the input of a level shifting buffer amplifier 46, the output of which is connected by conductor 43 to buffer inputs of control circuits 30E-30H.

Each of control circuits 30A-30H is essentially identical to the others, so only control circuit 30A will be described in detail. It includes a resistor 31 connected between $+V_{CC}$ and conductor 32A. Conductor 32A is coupled to the source electrode of P-channel JFET 33, the drain of which is connected by conductor 35 to the base of NPN transistor 34 and the anode of diode 36 (which is implemented as a diode-connected NPN transistor having an emitter area equal to one fifth of the emitter area of transistor 34). The cathode of diode 36 is connected by conductor 37A to the emitter of transistor 34 and to the source and gate electrodes of P-channel JFET 38. The drain of JFET 38 is connected to conductor 26. The gate electrode of JFET 33 is connected to the collector of transistor 34 and to $+V_{CC}$.

Table 1 lists exemplary values for the various resisters shown in FIG. 1, although one skilled in the art can readily supply suitable resistances to suit his or her specific design objectives.

TABLE 1

| Resistor | Kilohms |
|---|---|
| 20,45 | 25 |
| 24A | 18 |
| 24B | 1.8 |
| 24C | 0.18 |
| 24D | 0.04 |
| 24E | 0.18 |
| 24F | 1.8 |
| 24G | 18 |
| 31 | 5 |
| 47 | 25 |
| 48 | 25 |

Figure 2:
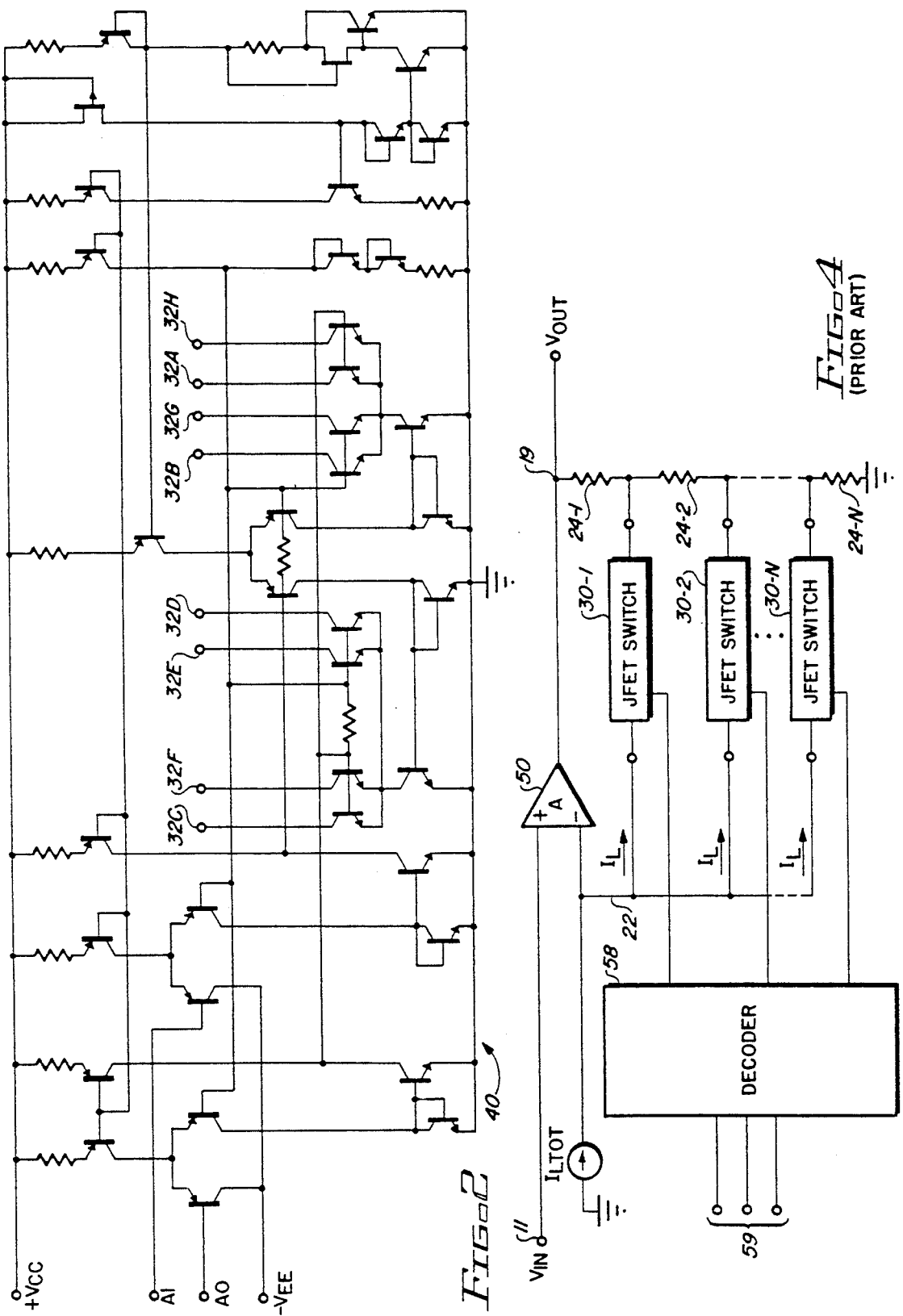
FIG. 2 is a detailed circuit schematic diagram of the decoder 40 of FIG. 1.
Figure 3:
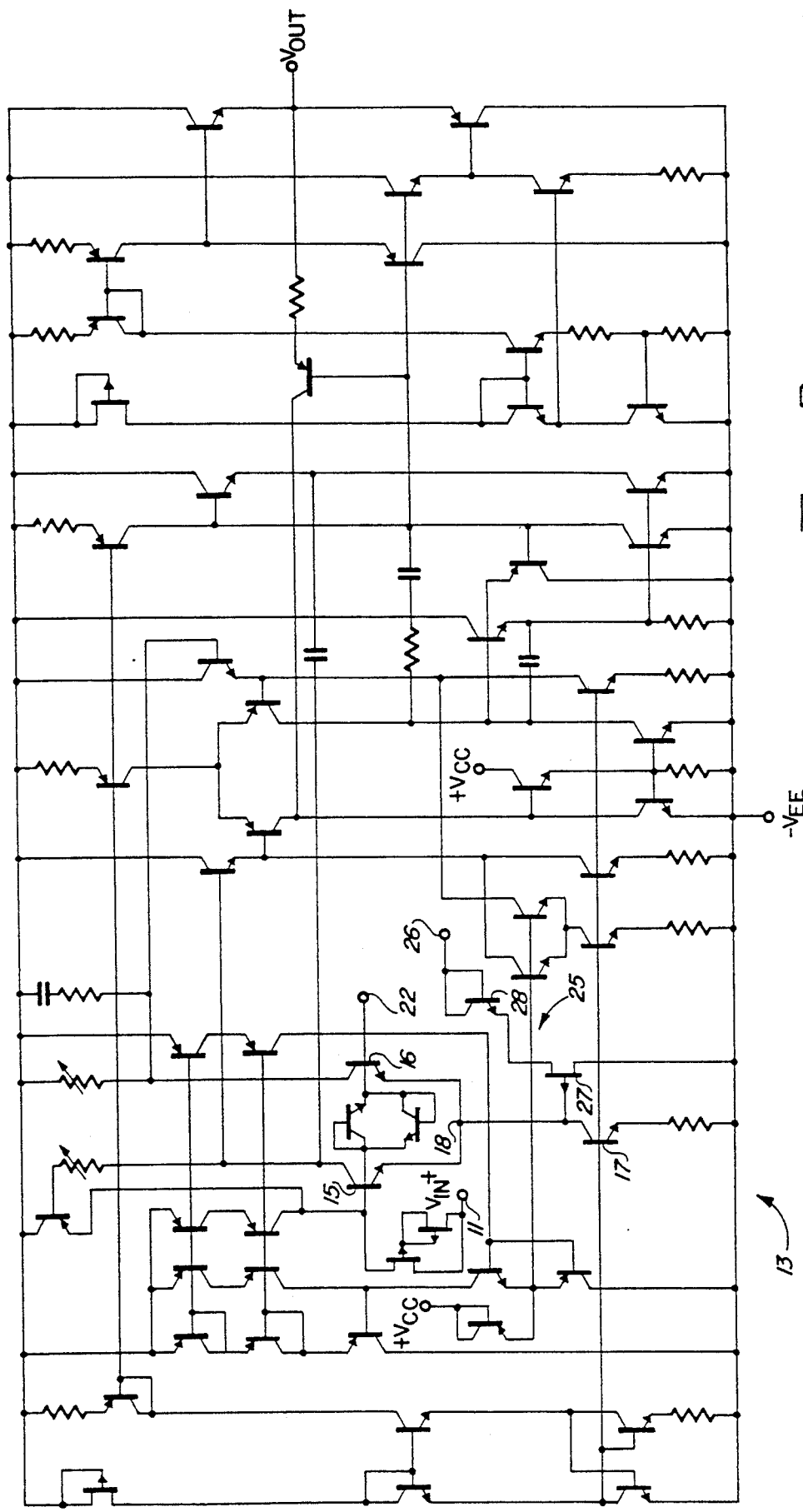
FIG. 3 is a detailed circuit schematic of the amplifier circuitry contained in blocks 13 and 25 of FIG. 1.
Figure 5:
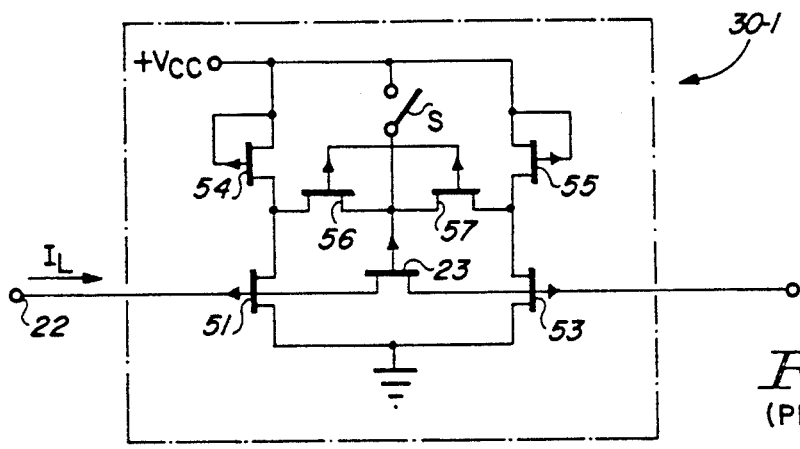
FIG. 5 is another diagram useful in describing the prior art.

A presently preferred implementation of decoder circuit 40 is shown in FIG. 2, with the control conductors 32A-32H being identified and the two gain selection inputs A1 and A0 also being identified. The four logical combinations of A1 and A0 allow four different gain values to be selected for programmable gain amplifier 10. The implementation of decoder circuit 40 is straightforward, and one skilled in the art can easily supply device geometries and component values to meet his or her circuit design objectives. Or, various alternate decoder circuit configurations could be used instead. For completeness, FIG. 3 shows a detailed circuit schematic diagram of amplifier 13, which includes level shifting buffer amplifier 25. Again, the implementation of amplifier 13 is straightforward, and one skilled in the art can readily supply the various device geometries and component values (or alternate circuit configurations) to meet his or her particular circuit design objectives. Buffer amplifier 25 is implemented by means of P-channel JFET 27 and diode-connected NPN transistor 28 in FIG. 3. Conductors 11 and 22, input transistors 15 and 16, current source 17, and common emitter conductor 18 have been labeled in FIG. 3 to illustrate precisely how amplifier 13 is connected into the diagram shown in FIG. 1. The implementation of amplifier 14 and buffer 46 is essentially similar to what is shown in FIG. 3.

It should be appreciated that in the differential programmable gain amplifier circuit structure shown in FIG. 1, which includes two operational amplifiers 13 and 14, rather than a single operational amplifier as shown in FIG. 4, cancellation of equal parasitic input offset currents such as $I_{LTOT}$ in FIG. 4 is achieved if the operational amplifiers 13 and 14 are identical, because the input offsets will be of a common mode nature.

Therefore, gain errors are produced in programmable gain amplifier as a result of parasitic leakage offset current such as $I_{LTOT}$ only to the extent that those parasitic input offset currents are unequal or mismatched.

One integrated circuit implementation of the above described circuit configuration has an input offset specification of approximately 50 microvolts, and the typical input offset voltage is only approximately 20 microvolts at 25 degrees Centigrade, and at the highest specification temperature of 125° Centigrade the input offset voltage typically is only 35 microvolts.

The operation of the programmable gain amplifier can be easily understood if the operation of control circuit 30A is understood. Control circuit 30 contains internal circuitry responsive to the digital gain control inputs A0 and A1 to open or close a switch 61, so that if switch 61 is closed a current source 60 pulls control conductor 32A to $V_{CC}-V_P$, where $V_P$ is the pinch-off voltage of JFET 33, turning off current source JFET 33. If switch 61 is open in response to the gain setting control inputs A0 and A1, resistor 31 and JFET 33 cooperate to bring conductor 37A close to $+V_{CC}$. If P-Channel gain switch JFET 23A is to be turned on, so as to cause it to approximate an electrical short circuit between its source and drain electrodes, its gate electrode must be brought to the same voltage as its source and drain electrodes, i.e., it must be biased to its "triode" region (which is well understood by those skilled in the art).

In control circuit 30A, NPN transistor 34 and diode 36 act as a follower circuit that tends to cause the voltage on conductor 37A to "follow" a rising "deselect" voltage on conductor 32A. When the "deselect" voltage on conductor 32A is pulled up to approximately $+V_{CC}$, a voltage level of $V_{CC}-V_{BE34}$ is produced on conductor 37A and hence on the gate electrode of gain switch JFET 23A, thereby turning it off ($V_{BE34}$ being the base-to-emitter voltage of transistor 34). In this case, the high voltage on conductor 32A biases JFET 38 in its current saturation region, producing a high impedance between conductors 37A and 26, thus isolating the output of buffer 25 from conductor 37A. Because of the slow response of operational amplifier 13, the gate-to-source junction of switching JFET 23A can become forward biased during transient response of the circuit to a fast negative-going input voltage applied to terminal 11. For the present embodiment of programmable gain amplifier 10, recovery from such forward biased condition is fast enough that no undesirable change is produced in $V_{OUT}$.

If switch 61 of decoder 40 is closed in response to the control inputs A0 and A1 so that a "select" voltage of $V_{CC}-V_P$ appears on control conductor 32A, then JFET 33, transistor 34, and diode 36 are off, producing a very high impedance at conductor 37A, allowing it to rapidly respond to changes in the voltage produced on conductor 26 by buffer 25. The voltage on common mode conductor 18, which is one $V_{BE}$ below the highest of $V_{IN}^+$ and $V_{IN}^-$, is sensed by JFET 27 (FIG. 3) in buffer 25 and is level-shifted up by $V_{BE}$ voltage by diode-connected NPN transistor 28 in FIG. 3 to the original common mode input voltage level and appears on conductor 26. (Recall that level-shifting buffer 25A is implemented by means of JFET 27 and diode-connected transistor 28 in FIG. 3.)

With transistor 34 and diode 36 both off, and with JFET 38 biased in its triode region so as to produce a short circuit between its source and drain electrodes, the voltage level produced on conductor 26 is applied by JFET 38 and conductor 37A to the gate electrode of gain switching JFET 23A. Since the source electrode of JFET 23A is connected by conductor 22 to the inverting input of operational amplifier 13, it also has a voltage corresponding to the input signal level applied thereto. JFET 23A therefore is turned on and maintained in its triode region, so its drain electrode and conductor 19 will be electrically coupled to the inverting input of operational amplifier, establishing one of the four possible values of gain for programmable gain amplifier 10. With switching JFET 23A being maintained in its triode region while conductor 32A is at its "select" voltage, the feedback voltage is precisely fed back through gain switching JFET 23A to conductor 22 for the selected gain determined by A0 and A1. If gain switching JFET 23A were to be not maintained in its triode region, and it were to enter into its current saturation region, voltage feedback through switching JFET 23A would not be precise, so the amplifier gain would be imprecise.

Note that operational amplifier 14 and buffer circuit 46 simultaneously function entirely similarly to operational amplifier 13 and buffer 25 in response to the present values of A0 and A1, producing a value of $V_{OUT}$ on the output of differential amplifier 21 equal to the selected gain multiplied by $V_{IN}^- - V_{IN}^+$.

The remaining control circuits 30B-30H function essentially the same as 30A in response to different configurations of control inputs $A_0$ and $A_1$ to electrically connect various junctions of gain setting resistors 24A-24G to the inverting inputs of operational amplifiers 13 and 14. The gain network nodes are switched to the inverting inputs of op amps 13 and 14 simultaneously in response to A0 and A1.

It should be appreciated that there are many other applications of the invention than the programmable gain amplifier wherein a source or drain of a field effect transistor is coupled to an input of an operational amplifier or the like, and in which the FET needs to be maintained in its triode region, despite large charges in the common mode component of the input voltage. It is intended that the present invention encompass any circuit in which a common mode voltage conductor in the operational amplifier is coupled to the gate electrode of the FET so as to translate the common mode voltage to the gate of the FET while it is supposed to be in its on condition.

Figure 6:
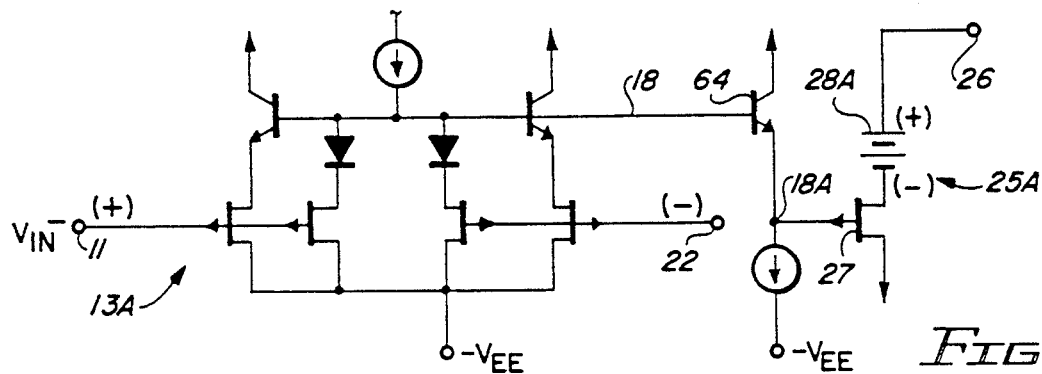
FIG. 6 is a schematic diagram of an alternative differential input stage that can be used in amplifiers 13 and 14 of FIG. 1.
Figure 7:
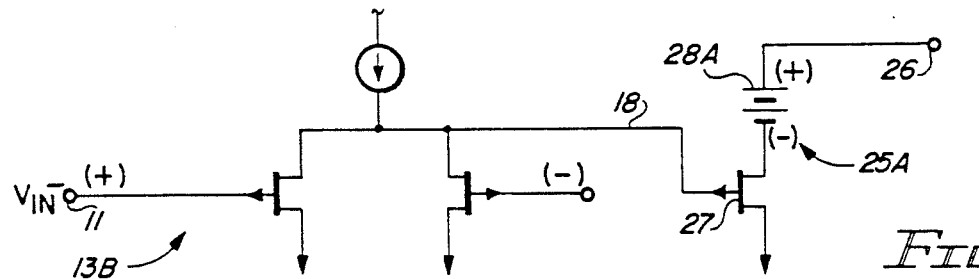
FIG. 7 is a schematic diagram of another alternative differential input stage that can be used in amplifiers 13 and 14 in FIG. 1.
Figure 8:
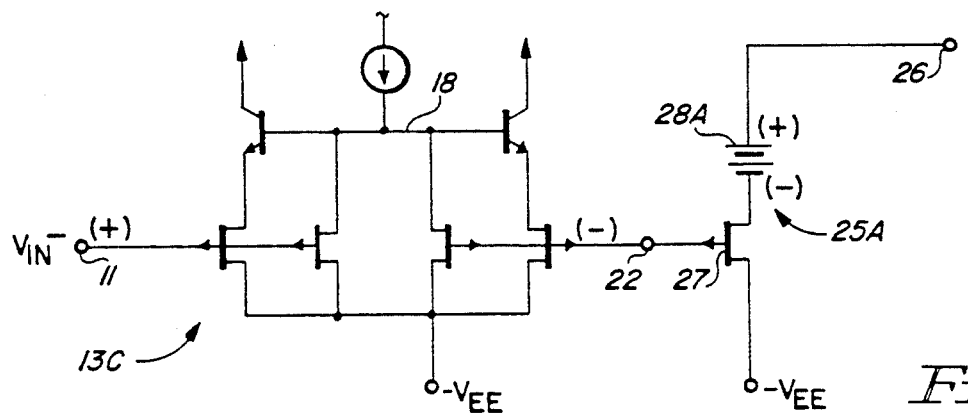
FIG. 8 is a schematic diagram of yet another alternative differential input stage that can be used in amplifier 13 and 14 of FIG. 1.

For example, FIG. 6 shows an alternate JFET differential input stage that could be included in amplifiers 13 and 14 instead of the bipolar NPN transistor differential input stage shown in FIG. 1. In FIG. 6, the signal on common mode conductor 18 is at a level that is equal to the average between the voltage levels on the inverting and non-inverting inputs plus a level shift of one $V_{BE}$ voltage. The voltage on common mode conductor 18 is level shifted down by the $V_{BD}$ voltage of emitter follower 64 to conductor 18A, which is applied to the gate of input JFET 27 of buffer 25A. The voltage produced on the source of JFET 27 is level shifted up to conductor 26 by level shift circuit 28A, schematically represented by a constant voltage source. Alternatively, the JFET differential input stage in FIG. 7 or FIG. 8 could be used. In FIG. 8 the input of buffer 25A is connected directly to the inverting input of differential input stage 13C, rather than being coupled to and driven in response to common mode conductor 18. The embodiment of FIG. 8 might be especially suited to an integrated circuit programmable gain amplifier manufactured using a Dielectric Isolation (DI) process, because gate-to-substrate parasitics thereof would be much smaller than for more standard integrated circuit manufacturing processes. If the differential input stage of FIG. 6, FIG. 7 or FIG. 8 is used, buffer amplifiers 25 and 46 would have a different configuration than shown in FIG. 3 to level shift the voltage at the drain of JFET 27 in FIG. 3 by a suitable amount. The "DC" level shift produced by circuit 28A in each case is the amount of level shift needed to cause the signal on conductor 26 to be equal to the $V_{IN}^-$ signal on conductor 11. It should be appreciated that the common node conductor 18 referred to herein can be any conductor that produces a voltage which is a shifted average of the two input signals applied to the inverting or non-inverting inputs of the amplifiers 13 and 14 respectively. For example, conductor 30 in FIG. 3 of commonly assigned U.S. Pat. No. 4,901,031 "COMMON-BASE, SOURCE-DRIVEN DIFFERENTIAL AMPLIFIER" issued Feb. 13, 1990 to Kalthoff et al. is such a common node conductor.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A programmable gain amplifier comprising in combination:
    (a) a first operational amplifier including a first differential input stage having a first common mode conductor coupling current carrying electrodes of first and second input transistors to a first current source, a control electrode of the first input transistor being coupled to a non-inverting input of the first operational amplifier, a control electrode of the second input transistor being coupled to an inverting input of the first operational amplifier, the non-inverting input receiving a first input signal, the first common mode conductor carrying a first signal level representative of the first input signal;
    (b) a first buffer circuit having an input coupled to the first common mode conductor and also having an output carrying a second signal level representative of the first input signal;
    (c) a gain network coupled between an output of the first operational amplifier and the inverting input of the first operational amplifier;
    (d) a first group of gain-switching JFETs coupling the gain network to the inverting input of the first operational amplifier; and
    (e) a first group of control circuit means, each coupled to the output of the first buffer circuit, for selectively applying the second signal level to a gate of one of the switching JFETs of the first group.

2. The programmable gain amplifier of claim 1 wherein the first and second transistors are bipolar transistors, the current carrying electrode of each of the first and second transistors being an emitter, the control electrode of each of the first and second transistors being a base.

3. The programmable gain amplifier of claim 2 including a second operational amplifier including a second differential input stage having a second common mode conductor coupling emitters of third and fourth input transistors to a second current source, a base of the third transistor being coupled to a non-inverting input of the second operational amplifier, a base of the fourth transistor being coupled to an inverting input of the second operational amplifier, the non-inverting input of the second operational amplifier receiving a second input signal the second common mode conductor carrying a third signal level representative of the second input signal, the programmable gain amplifier also including a second buffer circuit having an input coupled to the second common mode conductor and also having an output carrying a fourth signal level, the gain network being coupled between the outputs of the first and second operational amplifiers, a second group of gain switching JFETs coupling the gain network to the non-inverting input of the second operational amplifier, a second group of control circuit means each coupled to the output of the second buffer circuit, for selectively applying the fourth signal level to a gate of one of the gain switching JFETs of the second group.

4. The programmable gain amplifier of claim 2 wherein the first buffer circuit includes a JFET input transistor having a gate coupled to the first common mode conductor, and a level shift diode coupled between a source of the JFET input transistor and the output of the first buffer circuit to cause the second signal level to equal a level of the first input signal.

5. The programmable gain amplifier of claim 4 wherein each of the control circuit means includes a select input, first and second JFETS, a diode, an NPN transistor, a resistor coupled between a reference voltage conductor and the select input, the first JFET having a source coupled to the select input, a drain coupled to a base of the NPN transistor and an anode of the diode, a gate coupled to the reference voltage conductor and a collector of the NPN transistor, an emitter of the NPN transistor being coupled to the cathode of the diode, the gate and source of the second JFET, and the gate of one of the gain switching JFETs of the first group, the drain of the second JFET being coupled to the output of the first buffer circuit.

6. The programmable gain amplifier of claim 1 wherein the first and second transistors are field effect transistors, the current carrying electrode of each of the first and second transistors being a source electrode, the control electrode of each of the first and second transistors being a gate electrode.

7. A method of reducing input offset error in a high speed programmable gain amplifier including an operational amplifier having a non-inverting input receiving a first input signal, a differential input stage having a common mode voltage conductor carrying a first signal representative of the first input signal, a gain network coupled between an output and an inverting input of the operational amplifier, and a plurality of gain-switching JFETs coupling the gain network to the inverting input, the method including the steps of:
    (a) applying the first signal to an input of a buffer circuit, causing it to produce a second signal; and
    (b) coupling the second signal to a gate of one of the gain-switching JFETs to couple a conductor of the gain network to the inverting input if a gain select input signal is at a first logic level, and both isolating the gate of the one of the gain switching JFETs from the second signal and applying a turn-off voltage to the gate of the one of the gain switching JFETs if the gain select input signal is at a second logic level.

8. Circuitry for reducing input offset error in a high speed programmable gain amplifier including an operational amplifier having a non-inverting input receiving a first input signal, a differential input stage having a common mode voltage conductor carrying a first signal level representative of the first input signal, a gain network coupled between an output and an inverting input of the operational amplifier, and a plurality of gain-switching JFETs coupling the gain network to the inverting input, the circuitry comprising in combination:
 (a) a buffer circuit;
 (b) means for applying the first signal level to an input of the buffer circuit, causing it to produce a second signal level;
 (c) means for coupling the second signal level to a gate of one of the gain-switching JFETs to couple a conductor of the gain switching network to the inverting input if a gain select input signal is at a first logic level; and
 (d) means for both isolating the gate of the one of the gain switching JFETs from the second signal level and applying a turn-off voltage to the gate of the one of the gain switching JFETs if the gain select input signal is at a second logic level.

9. Circuitry for reducing input offset error in a high speed programmable gain amplifier including a first operational amplifier having a non-inverting input receiving a first input signal, a differential input stage having a first common mode voltage conductor carrying a first signal representative of the first input signal, a second operational amplifier having a non-inverting input receiving a second input signal, a differential input stage having a second common mode voltage conductor carrying a second signal representative of the second input signal, a gain network coupled to outputs of the first and second operational amplifiers and inverting inputs of the first and second operational amplifiers, and a plurality of gain-switching JFETs coupling the gain network to the inverting inputs, the circuitry comprising in combination:
 (a) first and second buffer circuits;
 (b) means for applying the first signal to an input of the first buffer circuit, causing it to produce a third signal;
 (c) means for applying the second signal to an input of the second buffer circuit, causing it to produce a fourth signal;
 (d) means for coupling the third signal to a gate of a first gain-switching JFET to couple a first conductor of the gain switching network to the inverting input of the first operational amplifier if a gain select input signal is at a first logic level;
 (e) means for coupling the fourth signal to a gate of a second gain-switching JFET to couple a second conductor of the gain switching network to the inverting input of the second operational amplifier if a gain select input signal is at the first logic level;
 (f) means for both isolating the gate of the first gain switching JFET from the third signal and applying a first turnoff voltage to the gate of the first gain switching JFET if the gain select input signal is at a second logic level; and
 (g) means for both isolating the gate of the second gain switching JFET from the fourth signal and applying a second turn-off voltage to the gate of the second gain switching JFET if the gain select input signal is at the second logic level.

10. A method of biasing a gain switching JFET in a programmable gain amplifier including an operational amplifier having a non-inverting input receiving an input signal, a differential input stage having a common mode voltage conductor carrying a first signal representative of the first input signal, a gain network coupled between an output of the operational amplifier and an inverting input of the operational amplifier, the gain-switching JFET coupling the gain network to the inverting input, the method including the steps of:
 (a) applying the first signal to an input of a buffer circuit, causing it to produce a second signal; and
 (b) applying the second signal to a gate of the gain-switching JFET to couple a conductor of the gain switching network to the inverting input if a gain select input signal is at a first logic level, and
 (c) if the gain select signal is at a second logic level, both (1) isolating the gate of the gain switching JFET from the second signal, and (2) applying a turn-off voltage to the gate of the gain switching JFET.

11. A method of biasing a JFET having a source or drain electrode coupled to a first input conductor of an operational amplifier, an input signal being carried by a second input conductor of the operational amplifier, the operational amplifier including a differential input stage having a common mode voltage conductor carrying a first signal representative of the input signal, the method comprising the steps of:
 (a) applying the first signal to an input of a buffer circuit, causing the buffer circuit to produce a second signal representative of the input signal; and
 (b) coupling the second signal to a gate of the JFET to cause the gate and the source of the JFET to be at substantially the same potential to maintain the JFET in its triode region despite large variations in the input signal.

12. The method of claim 11 wherein step (a) includes causing the buffer circuit to produce the signal equal to the input signal $V_{IN}{}^+$.

13. A method of biasing a JFET having a source or drain electrode coupled to a first input conductor of an operational amplifier, an input signal being carried by a second input conductor of the operational amplifier, the method comprising the steps o f:
 (a) applying the first input conductor to an input of a buffer circuit, causing the buffer circuit to produce a signal representative of the input signal; and
 (b) coupling the signal to a gate of the JFET to cause the gate and the source of the JFET to be at substantially the same potential as the input signal to maintain the JFET in its triode region despite large variations in the input signal.

14. The method of claim 13 wherein step (a) includes causing the buffer circuit to produce the signal equal to the input signal.

15. A programmable gain amplifier comprising in combination:
 (a) a first operational amplifier having an inverting input and a non-inverting input, the non-inverting input receiving an input signal;

(b) a buffer circuit having an input coupled to the inverting input and also having an output carrying an output signal representative of the input signal;
(c) a gain network coupled between an output of the operational amplifier and the inverting input of the operational amplifier;
(d) a group of gain-switching JFETs coupling the gain network to the inverting input of the operational amplifier; and
(e) a first group of control circuit means, each coupled to the output of the buffer circuit, for selectively applying the output signal to a gate of one of the gain-switching JFETs of the group.

* * * * *